United States Patent [19]

Carnes

[11] 4,040,092
[45] Aug. 2, 1977

[54] SMEAR REDUCTION IN CCD IMAGERS

[75] Inventor: James Edward Carnes, North Brunswick, N.J.

[73] Assignee: RCA Corporation, New York, N.Y.

[21] Appl. No.: 711,448

[22] Filed: Aug. 4, 1976

[51] Int. Cl.$^2$ .............................................. H04N 5/30
[52] U.S. Cl. ................................ 358/213; 250/211 R; 250/578; 358/223
[58] Field of Search ....................... 358/223, 212, 213; 250/211 J, 211 R, 578

[56] References Cited

U.S. PATENT DOCUMENTS

| | | | |
|---|---|---|---|
| 3,576,392 | 4/1971 | Hofstein | 178/7.1 |
| 3,934,161 | 4/1974 | Caywood | 307/311 |
| 3,940,602 | 2/1976 | Lagnado et al. | 235/181 |

Primary Examiner—Robert L. Richardson
Attorney, Agent, or Firm—H. Christoffersen; Samuel Cohen

[57] ABSTRACT

Radiation illuminating the A register of a charge-coupled device (CCD) imager of the field transfer type during the transfer of a field from the A to the B register results in smear in the reproduced image. Such smear is reduced in a rear surface illuminated imager by forming a depletion region at said rear surface during the A to B transfer time. Charge carriers which are excited in the substrate during this period preferentially remain at the rear surface where they are passed to a drain rather than flowing to the potential wells whose contents are being shifted from the A to the B register.

2 Claims, 10 Drawing Figures

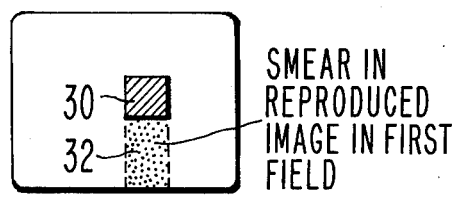
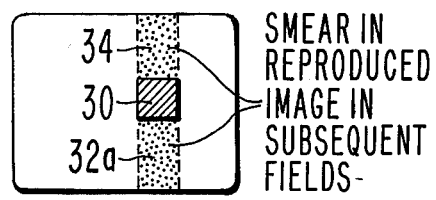
Fig. 3a
Fig. 3b
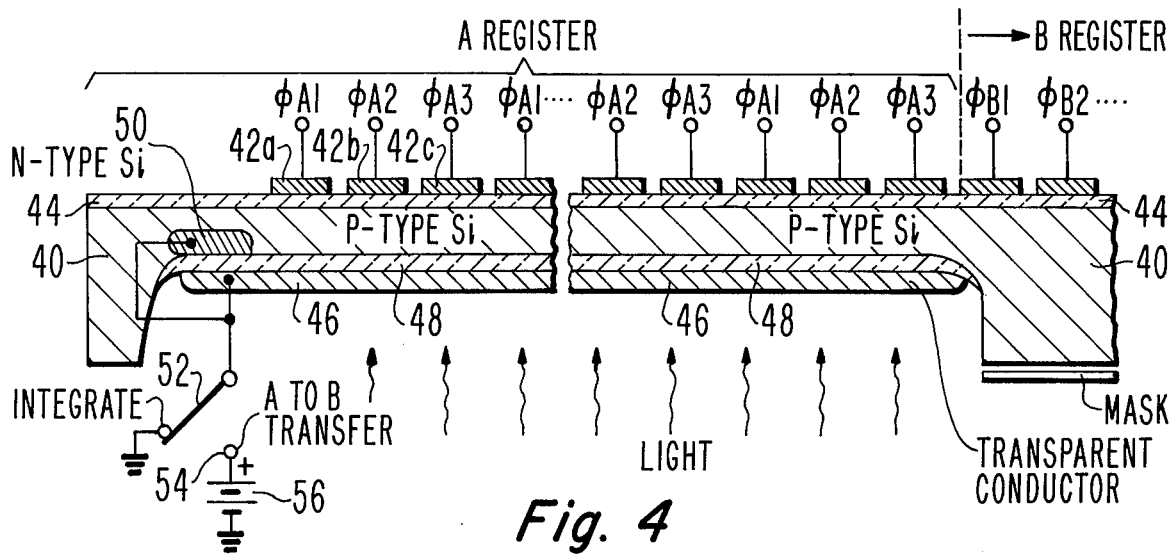
Fig. 4
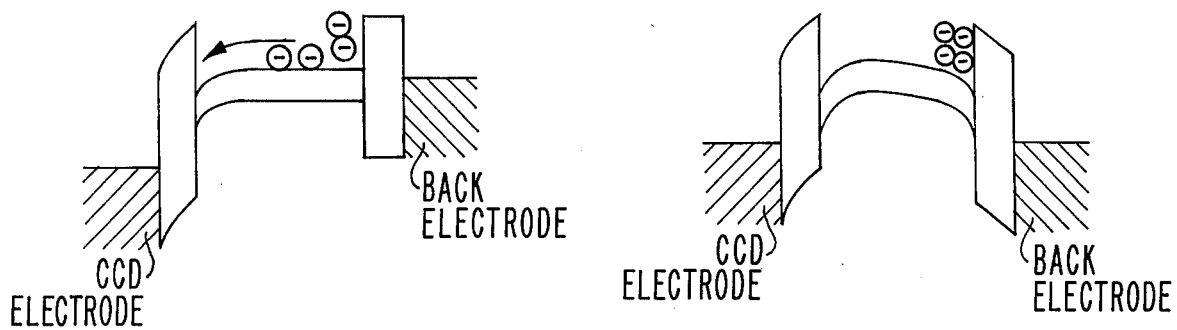
Fig. 5
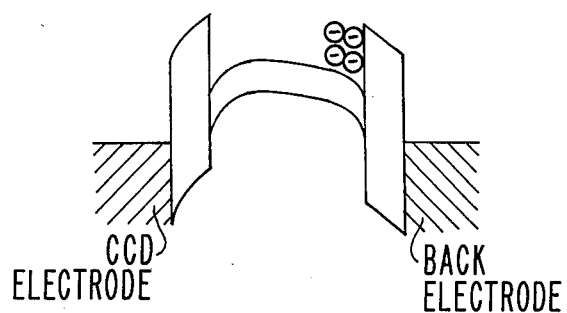
Fig. 6
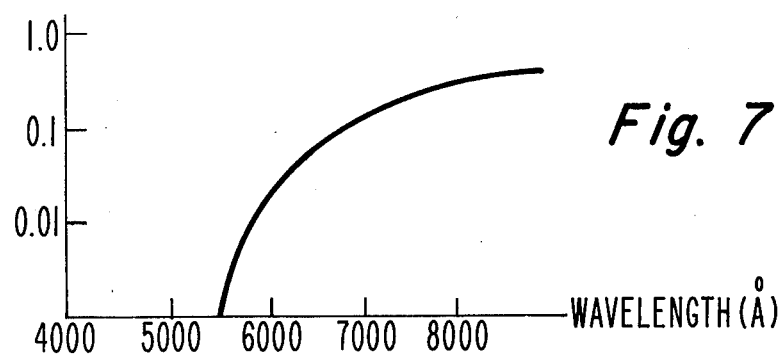
Fig. 7

SMEAR REDUCTION IN CCD IMAGERS

The present application deals with charge-coupled device imagers and more particularly with the problem of smear in such imagers. In the drawing:

FIGS. 3a and 3b show how smear is manifested in the reproduced image;

FIG. 4 is a section through an A register embodying the invention;

Figure 1:
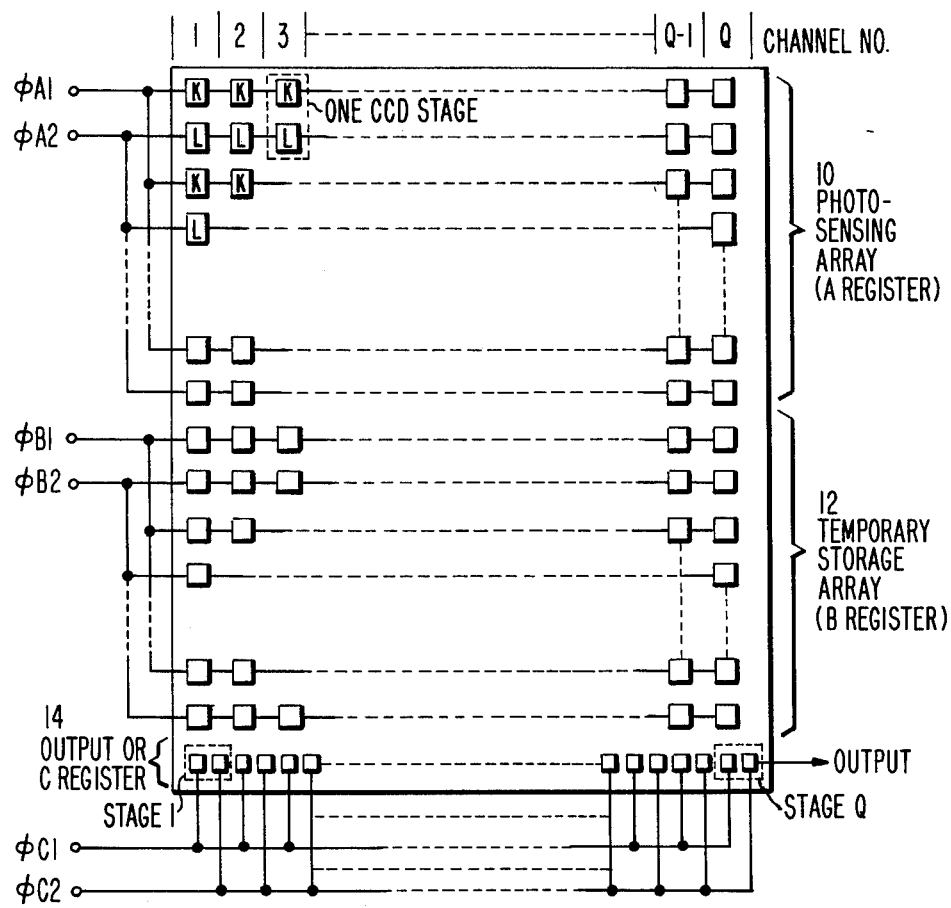
FIG. 1 is a schematic showing of a known CCD imager of the field-transfer type.

FIGS. 5 and 6 are energy band diagrams to illustrate the operation of the system of FIG. 4; and FIG. 7 is a graph to illustrate the attenuation of smear as a function of wavelength of an embodiment of the invention. The known system of FIG. 1, a two-phase charge-coupled device (CCD) imager, includes a photosensing array 10, known as an A register, a temporary storage array 12, known as a B register, and an output register 14, known as a C register. The B and C registers are masked, that is, means (not shown) are provided for preventing a radiant energy image from reaching either register.

The A and B registers may have channel stops (not shown explicitly) extending in the column direction to isolate the channels (the columns of the CCD) from one another. The electrodes (K and L, per stage) shown schematically, may be any one of the usual overlapped polysilicon, or polysilicon overlapped by metal, or other two-phase structures for insuring unidirectional signal propagation. The imager, while illustrated to be two-phase operated may be, of course, a three or higher phase operated imager instead. One such imager, commercially available from RCA Corporation is Sid 51232 and known as "Big Sid," is three-phase operated and has 320 columns and 512 rows (256 in the A register and 256 in the B register).

The operation of the array of FIG. 1 is well understood. During the so-called integration time, a scene or other image is projected onto the A register. The light or other radiant energy of the image causes charges to be produced at the various locations of the A register, in accordance with the light intensity reaching the respective locations.

Upon the completion of the integration time (during the vertical blanking interval of commercial television), the charge signals which have accumulated (a "field") are transferred, in parallel, in the column direction from the A to the B register by the application of the multiple phase voltages $\phi A1$, $\phi A2$, $\phi B1$ and $\phi B2$. The charges subsequently are transferred, a row at a time, from the B register to the C register, and after each row of charges reaches the C register, it is serially shifted out of the C register in response to the shift voltages $\phi C1$, $\phi C2$. The serial shifting of the C register occurs at a relatively high speed (during a "line time" of commercial television). During the transfer of a field from the B to the C register, a new field may be integrated in the A register.

Assuming a P type substrate, during the integration time $\phi A1$ may be relatively positive and $\phi A2$ less positive (or negative). The minority carriers (electrons) which are excited in the substrate in response to the radiation will become stored beneath the $\phi A1$ (the K) electrodes.

During the period the accumulated charge signals are shifted from the A to the B register, the radiation which continues to illuminate the A register produces smear in the reproduced image. The smear is directly proportional to the radiation intensity and to the number of rows illuminated (the size in the column direction of the image), and inversely proportional to the speed of transfer from the A to the B register. The mechanism by which the smear is generated is illustrated in FIG. 2 which illustrates what occurs when a bright image is present. It is to be understood, of course, that not-so-bright images also cause smear to be produced but at a lower intensity.

Figure 2A:
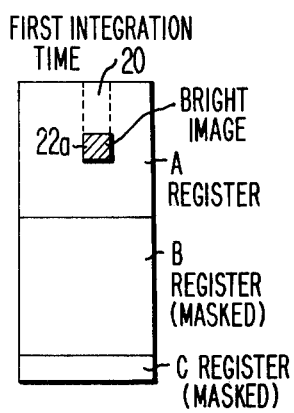
FIGS. 2a–2c are schematic showings which illustrate the problem of smear.

Referring first to FIG. 2a, assume that a scene (not shown) is being imaged onto the A register of the imager and that this scene includes a bright image, illustrated schematically by the square cross hatched area 22a. In the discussion which follows, only this bright image will be considered. During the first integration time, shown in FIG. 2a, the bright image causes charges to accumulate in the area of the substrate illuminated by the bright image.

Figure 2B:
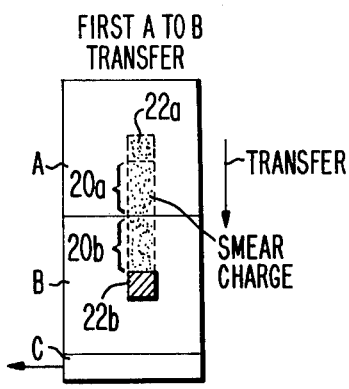

FIG. 2b illustrates what occurs during the first transfer of the field in the A register to the B register. This occurs, as already mentioned, during the vertical blanking time and at relatively high speed. During the transfer, the A register is not shuttered or masked in any other way. Therefore, the bright image remains focused on the substrate as the multiple phase voltages applied to the A and B registers transfer the charges from the A to the B register. During the transfer, the potential wells formerly in the region 20 of FIG. 1 pass beneath the bright image. While they do move at a relatively high speed, the bright image does cause a certain amount of charge signal to be produced and to accumulate in these potential wells. The greater the transfer speed, the fewer charges which will accumulate; however, the maximum speed at which the transfer can take place is limited by such factors as the capacitance and resistance of the charge transfer electrodes and other factors.

The result of the above is illustrated in FIG. 2b which shows the condition of the imager at the end of the first transfer time. The B register is storing the charge at 22b which was transferred from 22a of the A register. In the region 20b of the B register smear charge is present. This region 20b corresponds to the region 20 of FIG. 2a. There is also smear charge present in region 20a of the A register. Region 20a consists of potential wells moved under the bright image but which were not propagated sufficiently far to reach the B register.

Figure 2C:
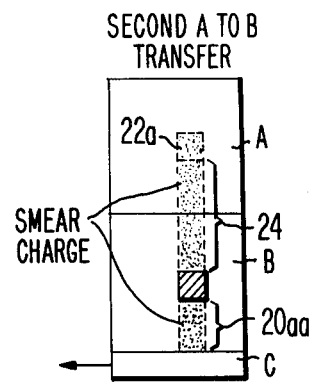

After the first transfer illustrated in FIG. 2b, there is a second integration time which is not illustrated and then a transfer of the second field from the A to the B register. At the end of the second transfer, the situation is as depicted in FIG. 2c. The smear charge formerly at 20a (FIG. 2b) has been shifted to position 20aa and there is also smear charge in the region 24 for reasons similar to those just discussed in connection with 20a and 20b of FIG. 2b.

As already mentioned, the charge signals transferred to the B register are later shifted out, a row at a time, to the C register and the contents of the C register are then transferred serially out of the C register. The signals shifted out of the C register are video signals and they may be subsequently displayed on the screen of a kinescope. The display, after the first transfer, is shown in FIG. 3a. There is a bright image at 30 corresponding to the bright image which caused the charge pattern 22a of FIG. 2a and there is smear at 32 below the bright image. Note there that the optical system in the imager causes the image projected on to the imager to be an upside-down version of the original scene and the readout, bottom line first, followed by the reconstituting of the image on the kinescope screen starting at the top line first, turns the picture over again. This is the reason the smear 32 appears at the bottom in the displayed image and on the top (20b) of the B register in FIG. 2b. Note also that the assumption is made in the illustrations of FIG. 2 that the observer is facing the surface illuminated of the A register and that the C register is read out right-to-left.

The smear 32 manifests itself as illumination at a lower intensity than the image 30 but which can be sufficiently visible appreciably to affect picture quality. Even five to ten percent smear is noticeable and it is not unusual to have smear levels of thirty percent or more of the intensity of the image 30. The latter are especially disturbing.

The display of FIG. 3a occurs only once and ordinarily is not seen, as such, by the observer. Rather the latter sees the display of FIG. 3b which occurs at the field repetition rate. The display of FIG. 3b corresponds to the charge pattern stored in the B register as shown in FIG. 2c. Note there is smear in the reproduced image both below and above the bright region 30. The smear 32a below the image corresponds to the smear charge at 33 above the information charge 22b in FIG. 2c and the smear 34 (FIG. 3b) above the image corresponds to the smear charge 20aa (FIG. 2c) below 22b. The reason for the inversion already has been mentioned.

Smear may be substantially reduced according to the invention by employing an A register constructed in the manner shown in FIG. 4. This register is one which receives radiation through its back surface and, for purposes of illustration, it is shown as a three-phase operated register.

The register includes a P type substrate 40 which is thinned in the region thereof upon which the image is projected. Thinning the substrate makes the imager more sensitive to the shorter wavelengths such as that of blue light. The electrode structure on the front surface is conventional and is illustrated schematically. In practice, the electrodes such as 42a, 42b, 42c and so on may be of single layer construction comprising polysilicon regions of one conductivity type separated from one another by polysilicon regions of opposite conductivity type as employed in the Big Sid imager described above or may be of any other type. These electrodes are insulated from the substrate by an insulating layer 44 formed of a material such as silicon dioxide. A transparent electrode 46, such as one formed of tin oxide (TIC), covers the back surface of the substrate and is insulated therefrom by layer 48 which may be formed of silicon dioxide. An N type region 50 is located at the rear surface of the substrate. Region 50, for example, may be a diffusion in the substrate.

In the operation of the system shown in part in FIG. 4, during the integration time one of the phase voltages such as $\phi A2$ may be maintained relatively positive and the remaining phase voltages $\phi A1$, $\phi A3$ held at a less positive or at a negative potential. The backplate electrode 46 and the diffusion 50 may be maintained at the same potential as the substrate. This may be accomplished by means of a switch, illustrated schematically as a mechanical switch 52, which connects the backplate 46 and diffusion 50 to ground, assuming the substrate to be at ground potential. In practice, rather than employing a mechanical switch, an electronic switch such as an MOS transistor circuit, is used instead. The minority carriers produced in response to photon excitation near the back surface of the substrate diffuse to the potential wells beneath the $\phi A2$ electrodes and collect in the usual manner. The energy band structure is normal as illustrated in FIG. 5. This figure shows that the minority carriers (electrons) excited at the back surface see a potential valley and travel to the front surface where they accumulate beneath the $\phi A2$ electrodes such as 42b.

During the A register to B register transfer time, switch 52 is switched to contact 54. In this position, a voltage source, illustrated as battery 56, places the backplate 46 at a positive potential. The value of voltage is such that a depletion region is formed adjacent to the back surface but which does not extend to the potential wells being propagated from the A to the B register by the multiple phase voltages. This depletion region tends to attract the minority carriers excited at the back surface of the substrate by the image projected thereon during the A to the B transfer time. This charge flows along the back surface until it reaches the diffusion 50 which is also at a positive potential and which operates as a drain for these charge carriers. This operation is depicted schematically in the energy band diagram of FIG. 6. This shows that the electrons excited at the back surface of the substrate tend to accumulate in the depletion region adjacent to this back surface.

FIG. 7 is a graph illustrating the performance of the system of FIG. 4, the graph being based on mathematical calculations. The graph assumes a substrate 40 thickness in the thinned region of 15μm (micrometers), a depletion region of 5μm depth adjacent to the back plate, and depletion region of 5μm depth adjacent to the most positive CCD electrodes. The attenuation factor A is plotted as a function of wavelength, where A is the ratio of radiation induced electrons which are collected with the backplate at a suitable positive potential to the radiation induced electrons collected with the backplate at substrate potential. It can be seen from the plot that most of the visible light wavelengths (4,000–7,000A) are attenuated significantly. At the longer wavelengths the attenuation is smaller. For example, at 7,000A the attenuation is about 20%. Below about 5,500A, the attenuation is substantially 100%, that is $A \cong 0$.

While the invention has been illustrated in terms of a surface channel CCD employing a P type substrate, it is of course to be understood that this is an example only. The circuit works equally well for N type substrate devices, provided suitable operating voltages are applied. The invention also is applicable to buried channel CCD's.

What is claimed is:

1. A method of operating a charge coupled imager of the type including an imaging area having a semiconductor substrate and columns and rows of electrodes adjacent to one surface of the substrate, means during successive integration times during which an image is projected onto the opposite surface of said substrate for maintaining certain of the electrodes at a potential to form potential wells in the substrate and other of the electrodes at a potential to form potential barriers in the substrate between adjacent potential wells, and which also includes means operative during a transfer time upon the completion of each integration time for applying multiple phase voltages to said electrodes for transferring a field of charge signals which have accumulated in said potential wells out of said imaging area, comprising the steps of:

- creating a depletion region at said opposite surface of said substrate during each transfer time for at least a substantial portion of the duration of each transfer time and of a depth sufficient to retain within said depletion region at least a substantial portion of the charge signals induced by the projected image during each transfer time, but of insufficient depth to prevent the transfer of said field of charge signals out of said imaging area;
- draining away said retained charge signals; and
- removing said depletion region during each integration time for the duration of said integration time.

2. A CCD imager system comprising, in combination:

- a CCD imager of the type including an A register having a substrate onto the back surface of which an image is projected, said register including a plurality of columns and a plurality of rows of integrating electrodes adjacent to the front surface of said substrate which during successive intervals of time, hereafter termed "integration periods," are maintained at a potential such that depletion regions are formed in the substrate for collecting charges in response to said projected image, and a masked B register comprising columns and rows of charge storage locations to which the charge pattern of the A register is shifted once each field time, after each field has been integrated in the A register and while the A register remains unmasked;
- a backplate electrode adjacent to and insulated from the back surface of said substrate of said A register and covering at least the major portion of said back surface;
- means operative during substantially each entire period said charge pattern is being shifted from the A to the B register for maintaining said backplate electrode at a potential to form a depletion region at the back surface of said substrate, and operative during substantially each entire integration period for maintaining said backplate electrode at a potential such that no depletion region is present at the back surface of said substrate; and
- means operative during substantially each entire period said charge pattern is being shifted from said A to said B register for draining away any charge carriers which accumulate in said depletion region adjacent to said back surface of said substrate.

* * * * *